United States Patent [19]

Statovici et al.

[11] Patent Number: 5,923,602
[45] Date of Patent: Jul. 13, 1999

[54] METHOD FOR TESTING FLOATING GATE CELLS

[75] Inventors: Mihai G. Statovici, San Jose; Ronald J. Mack, Gilroy, both of Calif.

[73] Assignee: Xilinx, Inc., San Jose, Calif.

[21] Appl. No.: 09/044,584

[22] Filed: Mar. 19, 1998

[51] Int. Cl.⁶ .................................................. G11C 7/00
[52] U.S. Cl. ................ 365/201; 365/185.22; 365/185.29
[58] Field of Search ............................... 365/201, 185.22, 365/185.29, 189.09

[56] References Cited

U.S. PATENT DOCUMENTS

| | | | |
|---|---|---|---|
| 5,109,257 | 4/1992 | Kondo | 357/23.5 |
| 5,675,544 | 10/1997 | Hashimoto | 365/201 |
| 5,675,546 | 10/1997 | Leung | 365/201 |
| 5,790,459 | 8/1998 | Roohparvar | 365/185.21 |

*Primary Examiner*—David Nelms
*Assistant Examiner*—Hoai V. Ho

*Attorney, Agent, or Firm*—Adam H. Tachner, Esq.; Crosby, Heafey, Roach & May; Lois D. Cartier

[57] ABSTRACT

A method is described for testing the programming function of integrated circuit device cells including floating gate elements. To accelerate the testing process, at most two programming pulses are needed, the two pulses being applied with the device at minimum and maximum power supply voltage levels specified for the device. First, the cell state after an initial programming pulse with the device at a minimum power supply voltage level, tested against a minimum reference voltage level, indicates whether the cell is programming properly. If not, testing ceases immediately and the device is rejected after the first pulse. Devices passing the first reading after the first pulse are subjected to a second reading at the target (higher) reference voltage. Devices passing after the second reading are designated as passing and are subjected to the next test in the test flow. Devices failing the second reading are subjected to a second programming pulse, applied with the device at the maximum power supply voltage level, the resulting cell state providing an indication of cell programming functionality. The same pulse series can also be used to test erase functionality.

22 Claims, 4 Drawing Sheets

METHOD FOR TESTING FLOATING GATE CELLS

BACKGROUND OF THE INVENTION

1. Field of the Invention

The present invention is related generally to semiconductor device testing, and specifically to testing the program and erase functions of a floating gate cell within a programmable device element.

2. Description of the Background Art

Semiconductor devices are typically fabricated in large lots on silicon wafers. The fabrication process includes various steps such as deposition, electron beam lithography, plasma etching, sputtering and other techniques well known to those skilled in the art of semiconductor fabrication. As with any manufacturing process, defects arise during semiconductor fabrication. These defects must be detected by the manufacturer before devices are delivered to customers.

In complex programmable logic devices (CPLDs, also known as erasable PLDs or EPLDs), floating gate elements are used to store a designed configuration. Floating gate element 5 is illustrated in FIG. 1 within a programmable EEPROM cell and in FIG. 2 within a CPLD FastFLASH™ transistor found in CPLDs available from Xilinx, Inc., the assignee of the present invention. For presently available Xilinx CPLDs, the normal test flow includes first programming the cell, then verifying that the cell was programmed sufficiently (that the cell is "off" and stable in its "off" state) by applying a predetermined reference voltage to control gate element 7 and checking for the expected "off" reading. The cell is then erased (set to an "on" state) and the erase function is similarly verified. The test flow then continues to test additional functions.

Thus, program and erase functionality of CPLDs is verified by applying a reference voltage to control gate 7 and verifying the transistor state. If the reference voltage level applied to the cell terminals provides the expected state of the cell at a designated point in time, then the cell passes the test and the test flow continues. If not, then according to the available testing method additional programming pulses are applied until a predetermined time period has passed. If the device still has not reached the desired state, the device fails.

There is, therefore, a weakness in the available testing method for program and erase functionality of floating gate elements: the length of time needed to determine whether a device is properly programmed or erased is inversely proportional to the device's measure of functionality. For example, referring to FIG. 3, test curve t1 indicates the response of a fully functional cell at the first program time marker 1 (e.g., the plotted output voltage is greater than a specified 9 volts at time marker 1). In contrast, response curve t2 does not indicate its functionality, and response curves t3 and t4 do not indicate their disfunction, until program time marker 3. Therefore, the testing of an element following any of curves t2, t3, and t4 clearly cannot be reliably accomplished before time marker 3.

The problem is exacerbated where, as with most functional tests, tests are performed with a minimal power supply voltage level to emulate worst-case operating conditions. For floating gate elements under such conditions, program and erase times are especially long, since very little energy is available for electrons to jump on or off floating gate 5 from control gate 7.

Thus, testing flawed or nearly flawed devices to see whether they have programmed or erased under specified operating conditions is especially time-consuming. For in-system programmable (ISP) device testing, where test data is shifted serially first into and then out of the device, there is an even more extreme time problem. Indeed, because of their serial nature, ISP tests can account for thirty percent or more of the overall test time required for a device. There is therefore a need in the art for a floating gate element testing procedure that provides reliable results but is not subject to the long delay periods associated with available methods when applied to devices having borderline pass or fail characteristics.

SUMMARY OF THE INVENTION

To address the shortcomings of the available art, the method of the present invention takes advantage of the predictably exponential nature of a programmable element response curve for program and erase times in programmable cells. The present invention provides a test method comprising the steps of extrapolating cell behavior after an abbreviated programming pulse with the device at minimum power, and making an early pass/fail decision from the available test result, followed by a final pass/fail decision based upon an abbreviated programming pulse with the device at maximum power. In other words, the method of the invention is based on the idea that if by a given time the charge on a floating gate has not reached a certain minimum voltage level, then the charge will not reach the target voltage level in the required programming time, and the device is rejected.

One embodiment of the present invention is applied to an integrated circuit device having a plurality of programmable cells, programming of each cell being verifiable at a specified minimum reference voltage level and a specified target reference voltage level. (By contrast, prior art methods verify a cell at a single reference voltage.) The method of this embodiment comprises the steps of: 1) applying a first programming signal to induce a first induced state in a cell within the device, the device being at a minimum power supply voltage level specified for the device; 2) at a first response measurement time, reading the induced state in a manner utilizing the specified minimum reference voltage level; 3) if the induced state is not the first desired state, rejecting the device and suspending further testing of the device; 4) reading the induced state in a manner utilizing the specified target reference voltage level; 5) if the induced state is at the first desired state, designating the device functional for programming and continuing to a next test in the test flow; 6) if the induced state is not at the first desired state, applying a second programming signal to induce a second induced state within the cell, the device being at a maximum power supply voltage level specified for the device; 7) reading the induced state at a second response measurement time; 8) if the induced state is not the second desired state, rejecting the device; and 9) if the induced state is at the second desired state, designating the device functional for programming and continuing to the next test in the test flow.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE DRAWINGS

Figure 1:
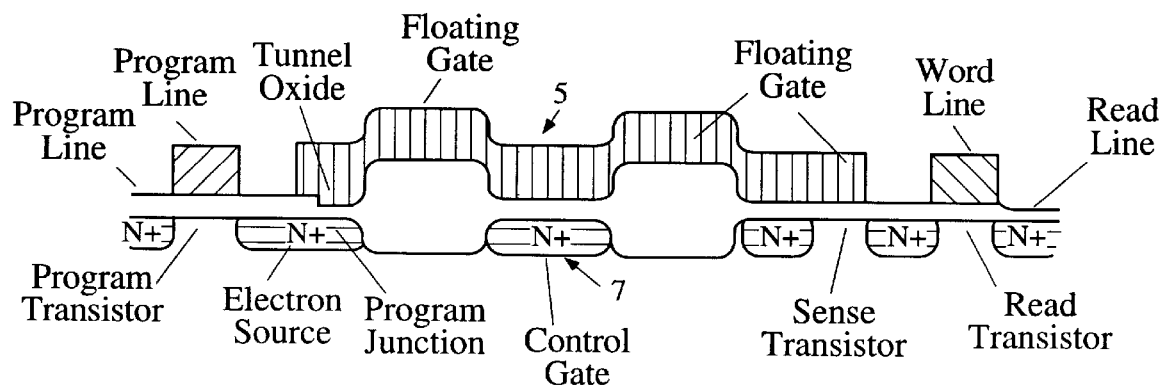
FIG. 1 is a cross-sectional view of an EEPROM cell including a floating gate element.
Figure 2:
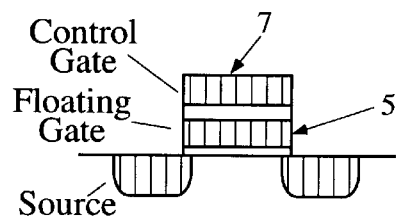
FIG. 2 is a cross-sectional view of a FastFLASH cell including a floating gate element.
Figure 3:
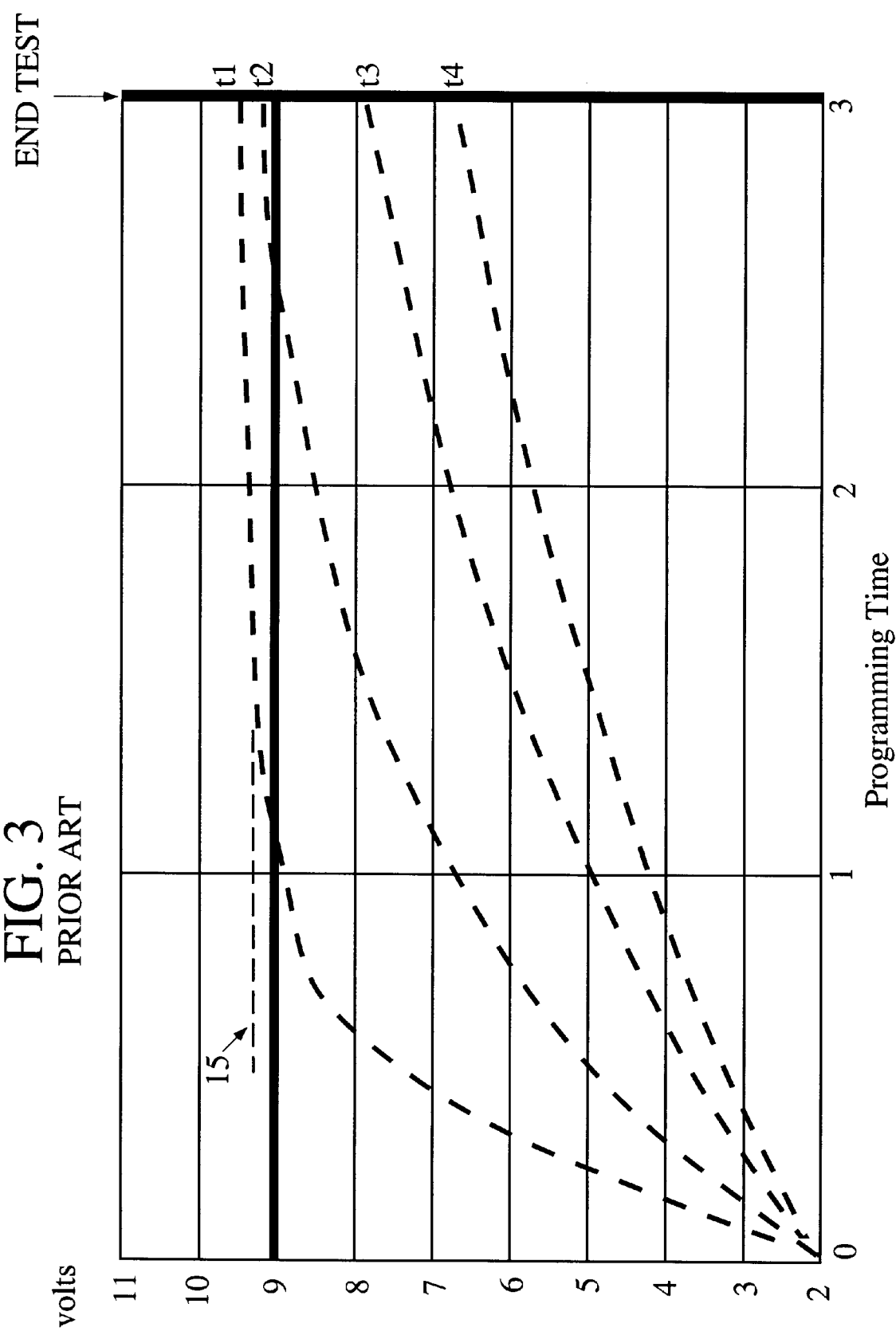
FIG. 3 is a graph illustrating a plurality of response curves for a prior art testing method.

In the tests implemented using an available method and illustrated as dashed-line response curves t1, t2, t3, and t4 in FIG. 3, a programming voltage level is applied to the control gate in a series of pulses (not illustrated). The time versus charge on the floating gate (proportional to the voltage level illustrated in the y-axis) follows an exponential curve, as can be seen in FIG. 3. Thus, the charge on the floating gate changes quickly at first in response to programming pulses, the rate of change slowing exponentially until a curve saturation level is reached (approximately at reference level 15 for curve t1, for example). The method of the present invention exploits this observed response characteristic.

Figure 4:
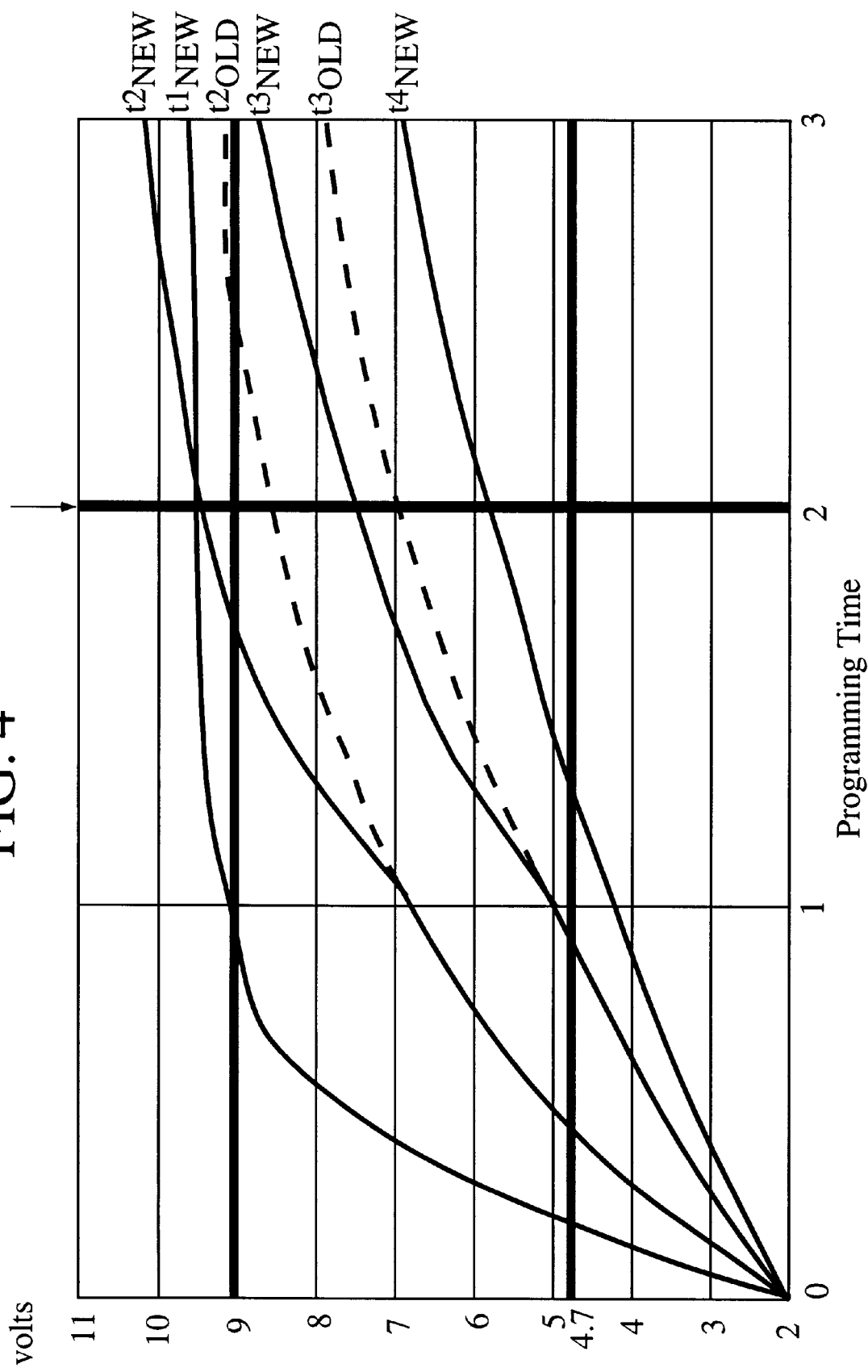
FIG. 4 is a graph illustrating the response of a plurality of tested device cells using the method of the present invention (shown with solid lines) and comparing the response of the present invention with those illustrated in FIG. 3.

Turning next to FIG. 4 and the method of the present invention, when a brief programming voltage pulse is applied with the device at a minimal power supply voltage level, a subsequent reading against a minimal reference voltage should reveal an "off" condition for a potentially good device. The response curves of FIG. 4 are therefore compared to two reference voltage levels, in contrast to the single reference voltage level used in the available method. First, after an abbreviated programming pulse with the device at a minimal power supply level (i.e., a minimal $V_{DD}$), the floating gate element is checked for state "off" by applying a reference voltage of 4.7 volts (equal to the minimal $V_{DD}$ for the device in the example provided). Then a second reading is taken by applying the target voltage level (e.g., 9 volts, as with the available test illustrated in FIG. 3). Next, after a second abbreviated pulse with the device at maximum $V_{DD}$, the floating gate charge level is tested by checking whether the device is "off" when the target voltage level is applied.

At time marker 1 in FIG. 4, a minimal reference voltage (4.7 volts for this example) is applied and it is determined whether the device under test is in its programmed state. If the device does not reveal the expected state by time marker 1, the cell is rejected. Thus, the device represented by curve t4 fails at the first pulse, and any device including a cell having a response curve similar to t4 would be immediately rejected. A second reading is then performed against the target voltage (in this example, 9 volts). If enough charge has accumulated on the floating gate element to read "off" (as for curve t1), then the device passes and the test flow moves on to the next test. If, however, as with t2 and t3, a cell state is verified for a minimal reference voltage but fails for the target voltage level, a second pulse is then applied, this time with the device at the maximum power supply voltage. Thus, for t2 and t3, a second pulse is applied at time marker 1. If the cell state is verified at time marker 2, the cell passes, otherwise it is rejected.

It is clear from comparing FIG. 4 to prior art FIG. 3 that the method of the invention has significantly reduced the testing time for the element. In a preferred embodiment, the average testing time using the method of the invention is equal to the best case testing time using available functional testing methods for floating gate elements. Shorter programming/reading cycles, enabled by the use of a lower reference voltage after the first pulse and by accelerated programming with the device at maximum power supply voltage during the second pulse, combined with the use of fewer programming/reading cycles overall, provide significant reductions in total test runtimes without diminishing the guaranteed quality of passed devices.

Therefore, as can be seen in FIG. 4, the method of the present invention exploits the floating gate response curve to reduce testing time, following exponential patterns having time constants highly dependent on process variations. Thus, a programmed cell that reads "off" (as compared to the target reference voltage) after either a first test pulse with the device at minimum power supply voltage or a second test pulse with the device at maximum power supply voltage, is guaranteed, within an acceptable quality assurance likelihood, to meet the operating specifications of the device (i.e., to be "off" after being programmed within operating specifications). Similarly, an erased cell that reads "on" after either the first or the second test pulse is guaranteed, within an acceptable quality assurance likelihood, to meet the operating specifications of the device (i.e., to be "on" after being erased within operating specifications). Moreover, depending on device characteristics, reliable test results can be provided by the method of the present invention after as little as one test pulse, and at most after only two test pulses, thereby substantially reducing the amount of time needed to thoroughly test a complete device.

Figure 5:
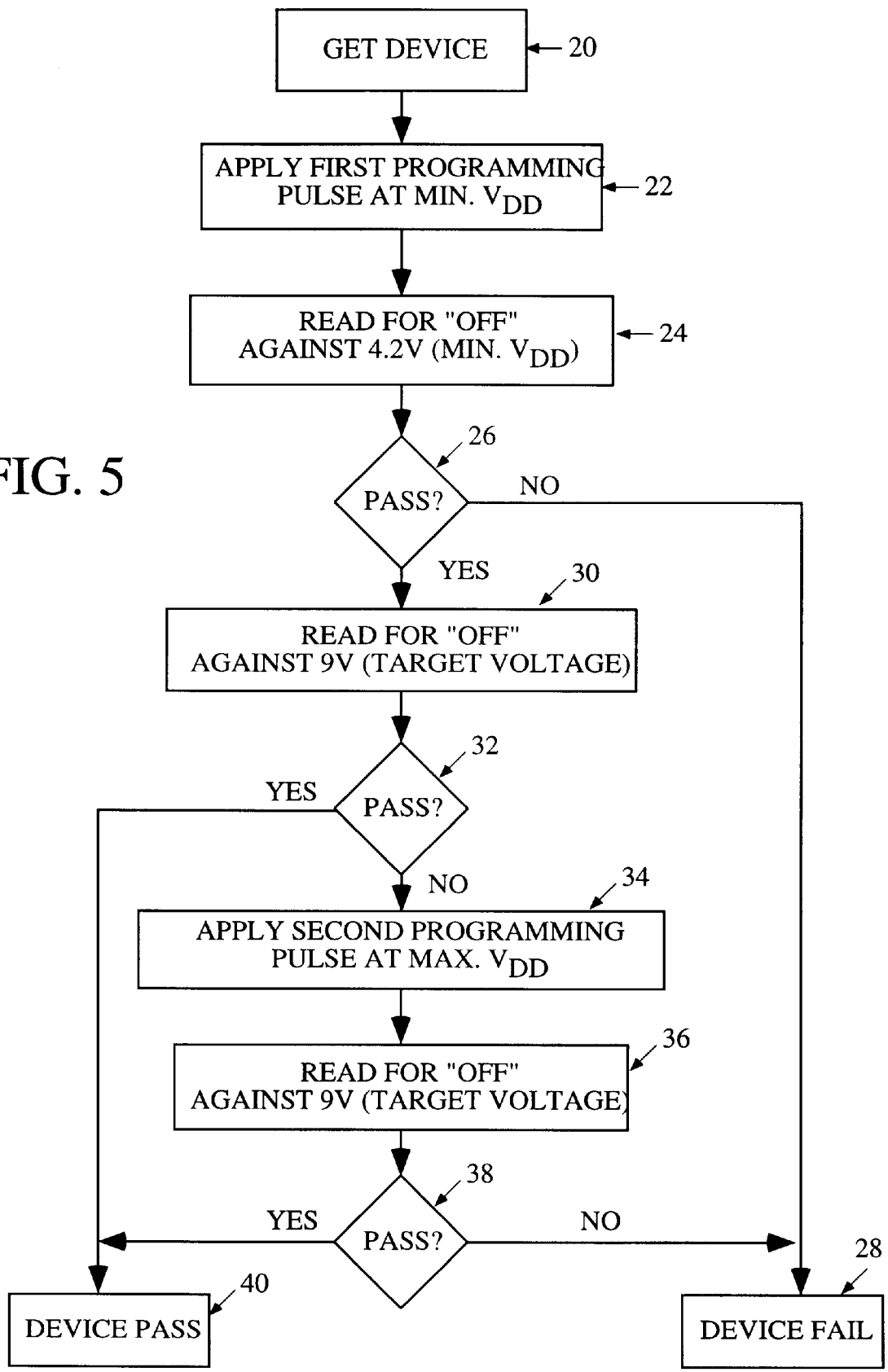
FIG. 5 is a flowchart illustrating the basic sequence of steps included in the method of the present invention for verifying device programming.

In FIG. 5, a flowchart is provided according to one embodiment of the invention, illustrating the programming and verification steps of the method. While no similar flowchart is provided for erase and verification, it should be understood that both programming and erase tests are preferably performed when a device is tested. Steps for testing and verifying erasability are easily developed after reviewing the flowchart in FIG. 5. It should also be understood that the method of the present invention is preferably implemented in a testing apparatus that is computer-controlled and utilizes software embodying the steps of the described method.

At step 20, a first device is obtained and all cells on the device are programmed with the device at minimum $V_{DD}$ at step 22. In an alternative embodiment, a first cell could be programmed and then verified before a next cell is programmed. At step 24, a first reading at a minimum reference voltage level is applied to the control gates of the cells. If, at step 26, any cell is found "on", the device is labeled a failure and the device is rejected (step 28). If, at step 26, all device cells are confirmed to be "off", then the test continues at step 30 with a second reading at the target voltage level. If at step 32 all the cells are found "off", the device is deemed to have passed the programming test, and the device test flow moves on to the next test (step 40). If not, a second programming pulse is applied at step 34, this time with the device at a maximum power supply level. At step 36, another reading at the target voltage level is applied. If the reading at step 36 reveals all cells "off", then at step 38 the device passes and at step 40 moves to the next test, for example, to a similar test for proper erase functionality. If any cell is found "on" at step 38, the device fails, testing is suspended, and the device is rejected (step 28).

While the present invention has been described with reference to certain preferred embodiments, those skilled in the art will recognize that various modifications and other embodiments may be provided. For example, erase and program functionality can be verified in block or alternating format with the disclosed method. These and other variations upon and modifications to the embodiment described herein are provided for by the present invention, which is to be limited only by the appended claims and their equivalents.

What is claimed is:

1. A method for testing a programmable cell in an integrated circuit device, the method comprising the steps of:

(a) applying a first programming signal to induce a first induced state in the cell, the device being at a minimum power supply voltage level specified for the device;

(b) at a first response measurement time, reading the first induced state in a manner utilizing a minimum reference voltage level specified for the device;

(c) if the first induced state is not at a first desired state, rejecting the device;

(d) reading the first induced state in a manner utilizing a target reference voltage level specified for the device;

(e) if the first induced state is at the first desired state, continuing to a next test;

(f) if the first induced state is not at the first desired state, applying a second programming signal to induce a second induced state within the cell, the device being at a maximum power supply voltage level specified for the device;

(g) reading the second induced state at a second response measurement time;

(h) if the second induced state is not at a second desired state, rejecting the device; and (i) if the second induced state is at the second desired state, continuing to the next test.

2. The method of claim 1, wherein the integrated circuit device includes in-system programmable (ISP) circuitry.

3. The method of claim 1, wherein the cell includes a floating gate element.

4. The method of claim 1, wherein the device is a complex programmable logic device (CPLD).

5. A method for testing a programmable cell in an integrated circuit device, the method comprising the steps of:

(a) applying a first erasing signal to induce a first induced state in the cell, the device being at a minimum power supply voltage level specified for the device;

(b) at a first response measurement time, reading the first induced state in a manner utilizing a minimum reference voltage level specified for the device;

(c) if the first induced state is not at a first desired state, rejecting the device;

(d) reading the first induced state in a manner utilizing a target reference voltage level specified for the device;

(e) if the first induced state is at the first desired state, continuing to a next test;

(f) if the first induced state is not at the first desired state, applying a second erasing signal to induce a second induced state within the cell, the device being at a maximum power supply voltage level specified for the device;

(g) reading the second induced state at a second response measurement time;

(h) if the second induced state is not at a second desired state, rejecting the device; and (i) if the second induced state is at the second desired state, continuing to the next test.

6. The method of claim 5, wherein the integrated circuit device includes in-system programmable (ISP) circuitry.

7. The method of claim 5, wherein the cell includes a floating gate element.

8. The method of claim 5, wherein the device is a complex programmable logic device (CPLD).

9. A method for testing a programmable cell in an integrated circuit device, the method comprising the steps of:

(a) applying a first programming pulse to the cell, the device being at a minimum power supply voltage level;

(b) after step (a), reading for a cell "off" state against a first voltage level;

(c) if the cell "off" state is not found in step (b), rejecting the device;

(d) if the cell "off" state is found in step (b), reading for a cell "off" state against a second voltage level;

(e) if the cell "off" state is found in step (d), continuing to a next test;

(f) if the cell "off" state is not found in step (d), applying a second programming pulse to the cell, the device being at a maximum power supply voltage level;

(g) after step (f), reading for the cell "off" state against the second voltage level;

(h) if the cell "off" state is found in step (g), continuing to the next test; and (i) if the cell "off" state is not found in step (g), rejecting the device.

10. A method for testing a programmable cell in an integrated circuit device, the method comprising the steps of:

(a) applying a first erasing pulse to the cell, the device being at a minimum power supply voltage level;

(b) after step (a), reading for a cell "on" state against a first voltage level;

(c) if the cell "on" state is not found in step (b), rejecting the device;

(d) if the cell "on" state is found in step (b, reading for a cell "on" state against a second voltage level;

(e) if the cell "on" state is found in step (d), continuing to a next test;

(f) if the cell "on" state is not found in step (d), applying a second erasing pulse to the cell, the device being at a maximum power supply voltage level;

(g) after step (f), reading for the cell "on" state against the second voltage level;

(h) if the cell "on" state is found in step (g), continuing to the next test; and (i) if the cell "on" state is not found in step (g), rejecting the device.

11. A software-based test apparatus for testing a programmable cell in an integrated circuit device, comprising:

(a) means for applying a first programming signal to induce a first induced state in the cell, the device being at a minimum power supply voltage level specified for the device;

(b) means for reading, at a first response measurement time, the first induced state in a manner utilizing a minimum reference voltage level specified for the device;

(c) means for rejecting the device if the first induced state is not at a first desired state;

(d) means for reading the first induced state in a manner utilizing a target reference voltage level specified for the device;

(e) means for continuing to a next test if the first induced state is at the first desired state;

(f) means for applying, if the first induced state is not at the first desired state, a second programming signal to induce a second induced state within the cell, the device being at a maximum power supply voltage level specified for the device;

(g) means for reading the second induced state at a second response measurement time;

(h) means for rejecting the device if the second induced state is not at a second desired state; and (i) means for continuing to the next test if the second induced state is at the second desired state.

12. The apparatus of claim 11, wherein the programmable device includes in-system programmable (ISP) circuitry.

13. The apparatus of claim 11, wherein each of the plurality of cells includes a floating gate element.

14. The apparatus of claim 11, wherein the device is a complex programmable logic device.

15. A software-based test apparatus for testing a programmable cell in an integrated circuit device, comprising:

(a) means for applying a first erasing signal to induce a first induced state in the cell, the device being at a minimum power supply voltage level specified for the device;

(b) means for reading, at a first response measurement time, the first induced state in a manner utilizing a minimum reference voltage level specified for the device;

(c) means for rejecting the device if the first induced state is not at a first desired state;

(d) means for reading the first induced state in a manner utilizing a target reference voltage level specified for the device;

(e) means for continuing to a next test if the first induced state is at the first desired state;

(f) means for applying, if the first induced state is not at the first desired state, a second erasing signal to induce a second induced state within the cell, the device being at a maximum power supply voltage level specified for the device;

(g) means for reading the second induced state at a second response measurement time;

(h) means for rejecting the device if the second induced state is not at a second desired state; and (i) means for continuing to the next test if the second induced state is at the second desired state.

16. The apparatus of claim 15, wherein the programmable device includes in-system programmable (ISP) circuitry.

17. The apparatus of claim 15, wherein each of the plurality of cells includes a floating gate element.

18. The apparatus of claim 15, wherein the device is a complex programmable logic device.

19. A software-based test apparatus for testing a programmable cell in an integrated circuit device, comprising:

means for applying a first programming pulse to the cell, the device being at a minimum power supply voltage level;

means for reading for a cell "off" state against a first voltage level;

means for rejecting the device, if the cell "off" state is not found;

means for reading, if the cell "off" state is found, for a cell "off" state against a second voltage level;

means for continuing to a next test if the cell "off" state is found;

means for applying, if the cell "off" state is not found, a second programming pulse, the device being at a maximum power supply voltage level;

means for reading for the cell "off" state against the second voltage level;

means for continuing to the next test if the cell "off" state is found; and means for rejecting the device if the cell "off" state is not found.

20. A software-based test apparatus for testing a programmable cell in an integrated circuit device, comprising:

means for applying a first erasing pulse to the cell, the device being at a minimum power supply voltage level;

means for reading for a cell "on" state against a first voltage level;

means for rejecting the device if the cell "on" state is not found;

means for reading, if the cell "on" state is found, for a cell "on" state against a second voltage level;

means for continuing to a next test if the cell "on" state is found;

means for applying, if the cell "on" state is not found, a second erasing pulse, the device being at a maximum power supply voltage level;

means for reading for the cell "on" state against the second voltage level;

means for continuing to the next test if the cell "on" state is found; and means for rejecting the device if the cell "on" state is not found.

21. A method for testing a programmable cell in an integrated circuit device, the method comprising the steps of:

(a) applying a first programming signal to induce a first induced state in the cell, the device being at a minimum power supply voltage level specified for the device;

(b) at a first response measurement time, reading the first induced state in a manner utilizing a minimum reference voltage level specified for the device;

(c) if the first induced state is not at a first desired state, rejecting the device;

(d) if the first induced state is at the first desired state, applying a second programming signal to induce a second induced state within the cell, the device being at a maximum power supply voltage level specified for the device;

(e) reading the second induced state at a second response measurement time;

(f) if the second induced state is not at a second desired state, rejecting the device; and (g) if the second induced state is at the second desired state, continuing to the next test.

22. A method for testing a programmable cell in an integrated circuit device, the method comprising the steps of:

(a) applying a first erasing signal to induce a first induced state in the cell, the device being at a minimum power supply voltage level specified for the device;

(b) at a first response measurement time, reading the first induced state in a manner utilizing a minimum reference voltage level specified for the device;

(c) if the first induced state is not at a first desired state, rejecting the device;

(d) if the first induced state is at the first desired state, applying a second erasing signal to induce a second induced state within the cell, the device being at a maximum power supply voltage level specified for the device;

(e) reading the second induced state at a second response measurement time;

(f) if the second induced state is not at a second desired state, rejecting the device; and (g) if the second induced state is at the second desired state, continuing to the next test.

* * * * *